(12) United States Patent
Coon et al.

(10) Patent No.: US 7,339,650 B2
(45) Date of Patent: Mar. 4, 2008

(54) IMMERSION LITHOGRAPHY FLUID CONTROL SYSTEM THAT APPLIES FORCE TO CONFINE THE IMMERSION LIQUID

(75) Inventors: Derek Coon, Redwood City, CA (US); Andrew J Hazelton, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/237,650

(22) Filed: Sep. 29, 2005

(65) Prior Publication Data
US 2006/0023184 A1    Feb. 2, 2006

Related U.S. Application Data

(63) Continuation of application No. PCT/US2004/009911, filed on Mar. 29, 2004.

(60) Provisional application No. 60/462,142, filed on Apr. 9, 2003.

(51) Int. Cl.
*G03B 27/52* (2006.01)
(52) U.S. Cl. ............................ 355/30; 355/67; 359/665
(58) Field of Classification Search ................... 355/30, 355/67; 359/665
See application file for complete search history.

(56) References Cited

U.S. PATENT DOCUMENTS

| | | |
|---|---|---|
| 3,648,587 A | 3/1972 | Stevens |
| 4,346,164 A | 8/1982 | Tabarelli et al. |
| 4,480,910 A | 11/1984 | Takanashi et al. |
| 4,509,852 A | 4/1985 | Tabarelli et al. |
| 5,610,683 A | 3/1997 | Takahashi |
| 5,715,039 A | 2/1998 | Fukuda et al. |
| 5,825,043 A | 10/1998 | Suwa |
| 6,262,796 B1 | 7/2001 | Loopstra et al. |
| 6,341,007 B1 | 1/2002 | Nishi et al. |
| 6,721,031 B2 * | 4/2004 | Hasegawa et al. ............ 355/30 |

(Continued)

FOREIGN PATENT DOCUMENTS

DE    221 563 A1    4/1985

(Continued)

OTHER PUBLICATIONS

Emerging Lithographic Technologies VI, Proceedings of SPIE, vol. 4688 (2002), "Semiconductor Foundry, Lithography, and Partners", B.J. Lin, pp. 11-24.

(Continued)

*Primary Examiner*—Diane I. Lee
*Assistant Examiner*—Chia-how Michael Liu
(74) *Attorney, Agent, or Firm*—Oliff & Berridge, PLC

(57) ABSTRACT

A fluid control system for immersion lithography that uses an optical member such as a lens, a workpiece such as a semiconductor wafer with a surface disposed opposite to the optical member with a gap in between, includes a fluid-supplying device for providing an immersion fluid such as water to a specified exposure area in the gap, and a fluid control device that activates a force on the fluid so that the immersion fluid is retained in the exposure area and its vicinity at least while the immersion lithography operation is being carried out. A pressured gas may be caused to apply a hydrodynamic force on the fluid to keep it in its place.

32 Claims, 5 Drawing Sheets

U.S. PATENT DOCUMENTS

| | | | |
|---|---|---|---|
| 6,781,670 B2 * | 8/2004 | Krautschik | 355/53 |
| 2002/0163629 A1 | 11/2002 | Switkes et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0225737 A1 | 10/2005 | Weissenrieder et al. | |
| 2005/0270505 A1 | 12/2005 | Smith | |

FOREIGN PATENT DOCUMENTS

| | | |
|---|---|---|
| DE | 224 448 A1 | 7/1985 |
| JP | A-57-153433 | 9/1982 |
| JP | A-58-202448 | 11/1983 |
| JP | A-59-19912 | 2/1984 |
| JP | A-62-65326 | 3/1987 |
| JP | A-63-157419 | 6/1988 |
| JP | A-4-305915 | 10/1992 |
| JP | A-4-305917 | 10/1992 |
| JP | A-5-62877 | 3/1993 |
| JP | A 06-124873 | 5/1994 |
| JP | A-7-220990 | 8/1995 |
| JP | A-8-316125 | 11/1996 |
| JP | A 10-303114 | 11/1998 |
| JP | A-10-340846 | 12/1998 |
| JP | A-11-176727 | 7/1999 |
| JP | A-2000-58436 | 2/2000 |
| WO | WO 99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |

OTHER PUBLICATIONS

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3rd 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Nikon Corporation, NGL Workshop, Jul. 10, 2003, :Potential performance and feasibility of immersion lithography, Soichi Owa et al., 33 pages, slides 1-33.

* cited by examiner

US 7,339,650 B2

IMMERSION LITHOGRAPHY FLUID CONTROL SYSTEM THAT APPLIES FORCE TO CONFINE THE IMMERSION LIQUID

CROSS-REFERENCE TO RELATED APPLICATIONS

This is a Continuation of International Application No. PCT/US2004/009911 filed Mar. 29, 2004, which claims the benefit of U.S. Provisional Patent Application No. 60/462,142 filed Apr. 9, 2003. The entire disclosures of the prior applications are hereby incorporated by reference herein in their entireties.

BACKGROUND

This invention relates to an immersion lithography system, such as described in W099/49504, having a fluid material supplied into the space between a workpiece such as a wafer and the last-stage optical member such as a lens of the optical system for projecting the image of a reticle onto the workpiece. The supplied fluid material may be pure water and its presence improves the performance of the optical system and the quality of the exposure.

The fluid material thus supplied into the space between the workpiece and the last-stage optical member tends to rise in temperature due to the radiation energy from the optical system, thereby causing its coefficient of refraction to change. If the fluid material remains in contact with the optical member and the workpiece over an extended period of time, furthermore, the fluid material tends to become polluted, and this also affects its coefficient of refraction. Also the fluid material tends to leak out of the space between the workpiece and the last-stage optical member because the workpiece is moved relative to the last-stage optical member. For these reasons, an immersion lithography system must be provided with an efficient fluid control system for constantly replenishing the lithography fluid.

A problem associated with such a fluid control system for an immersion lithography apparatus is how to control, or contain, the fluid material with which the space between the last-stage optical member and the workpiece is filled.

SUMMARY

A fluid control system according to this invention is for use in an immersion lithography apparatus comprising an optical member, a workpiece with a surface disposed opposite this optical member with a gap between the workpiece and the optical member, a fluid-supplying device for providing a fluid to a specified exposure area in the gap, and what may be broadly referred to as a fluid control device adapted to activate a force on the fluid supplied into the gap such that the fluid will be retained within and in the vicinity of the exposure area, and will be prevented from moving away from the intended limited area, that is, from entering a specified surrounding area external to the exposure area.

The force that is to be applied to the fluid has been described as a force of a kind that can be activated. This means that the force itself is of a controllable kind and excludes reaction forces from a stationary object such as a confining wall. A number of examples of activating a force on an immersion fluid are considered. One example is to activate a gas flow from a pressured gas source such that its hydrodynamic force is arranged to contain the fluid within and in the vicinity of the exposure area, that is, to prevent the fluid from entering the surrounding area where the fluid is not desired.

Another example is to activate a magnetostatic force in which the immersion fluid is of a magnetically responsive material. Powder of a ferromagnetic substance may be added to enhance the magnetic characteristic of the fluid.

Still another example is to make use of a rheological fluid as the immersion fluid. In the case of an electrorheological fluid, an electrostatic field of a suitable intensity may be activated by means of a suitably positioned pair of capacitor electrodes to increase its viscosity to practically solidify the fluid. In the case of a magnetorheological fluid, a magnetic field of a suitable intensity may be activated by means of suitably disposed coils so as to keep the immersion fluid contained.

BRIEF DESCRIPTION OF THE DRAWINGS

The invention will be described in conjunction with the accompanying drawings of exemplary embodiments in which like reference numerals designate like elements, and in which.

DETAILED DESCRIPTION OF EMBODIMENTS

Figure 1:
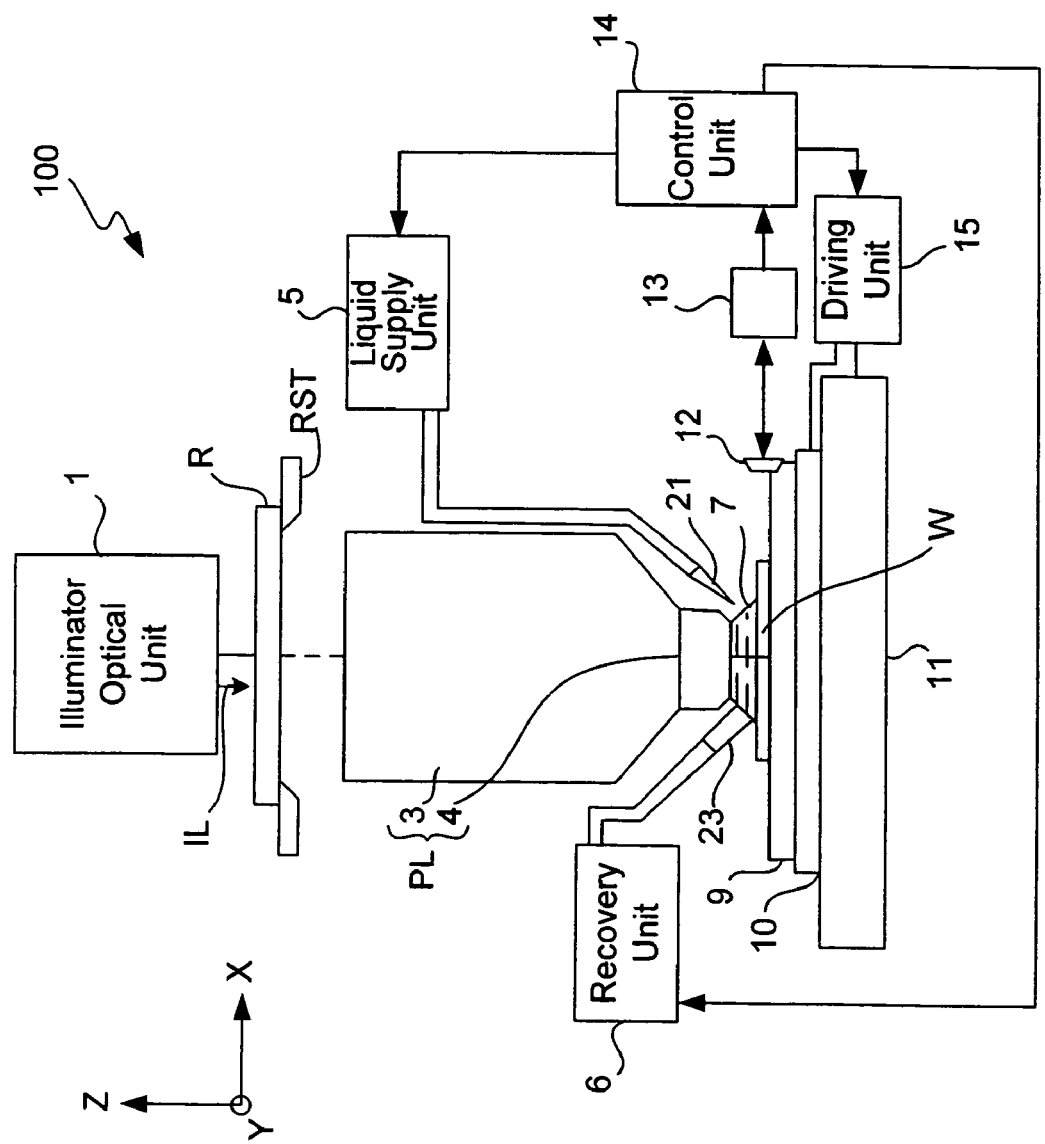
FIG. 1 is a schematic cross-sectional view of an immersion lithography apparatus to which methods and systems of this invention may be applied.

FIG. 1 shows an immersion lithography apparatus 100 that may incorporate a fluid control system of this invention.

As shown in FIG. 1, the immersion lithography apparatus 100 comprises an illuminator optical unit 1 including a light source such as a KrF excimer laser unit, an optical integrator (or homogenizer) and a lens and serving to emit pulsed ultraviolet light IL with wavelength 248 nm to be made incident to a pattern on a reticle R. The pattern on the reticle R is projected onto a wafer W coated with a photoresist at a specified magnification (such as ¼ or ⅕) through a telecentric light projection unit PL. The pulsed light IL may alternatively be ArF excimer laser light with wavelength 193 nm, $F_2$ laser light with wavelength 157 nm or the i-line of a mercury lamp with wavelength 365 nm. In what follows, the coordinate system with X-, Y- and Z-axes as shown in FIG. 1 is referenced to explain the directions in describing the structure and functions of the lithography apparatus 100. For the convenience of disclosure and description, the light projection unit PL is illustrated in FIG. 1 only by way of its last-stage optical element (such as a lens) 4 disposed opposite to the wafer W and a cylindrical housing 3 containing the rest of its components.

The reticle R is supported on a reticle stage RST incorporating a mechanism for moving the reticle R in the X-direction, the Y-direction and the rotary direction around the Z-axis. The two-dimensional position and orientation of the reticle R on the reticle stage RST are detected by a laser interferometer (not shown) in real time, and the positioning of the reticle R is affected by a main control unit 14 on the basis of the detection thus made.

The wafer W is held by a wafer holder (not shown) on a Z-stage 9 for controlling the focusing position (along the Z-axis) and the tilting angle of the wafer W. The Z-stage 9 is affixed to an XY-stage 10 adapted to move in the XY-plane substantially parallel to the image-forming surface of the light projection unit PL. The XY-stage 10 is set on a base 11. Thus, the Z-stage 9 serves to match the wafer surface with the image surface of the light projection unit PL by adjusting the focusing position (along the Z-axis) and the tilting angle of the wafer W by an auto-focusing and auto-leveling method, and the XY-stage 10 serves to adjust the position of the wafer W in the X-direction and the Y-direction.

The two-dimensional position and orientation of the Z-stage 9 (and hence also of the wafer W) are monitored in real time by another laser interferometer 13 with reference to a mobile mirror 12 affixed to the Z-stage 9. Control data based on the results of this monitoring are transmitted from the main control unit 14 to a stage-driving unit 15 adapted to control the motions of the Z-stage 9 and the XY-stage 10 according to the received control data. At the time of an exposure, the projection light is made to sequentially move from one to another of different exposure positions on the wafer W (hereinafter referred to as the workpiece W) according to the pattern on the reticle R in a step-and-repeat routine or in a step-and-scan routine.

The lithography apparatus 100 described with reference to FIG. 1 is an immersion lithography apparatus and is hence adapted to have a fluid (or the "immersion liquid") 7 of a specified kind such as water filling the space (the "gap") between the surface of the workpiece W and the lower surface of the last-stage optical element 4 of the light projection unit PL at least while the pattern image of the reticle R is being projected onto the workpiece W.

The last-stage optical element 4 of the light projection unit PL may be detachably affixed to the cylindrical housing 3 and is designed such that the liquid 7 will contact only the last-stage optical element 4 and not the cylindrical housing 3 because the housing 3 typically comprises a metallic material and is likely to become corroded.

The liquid 7 is supplied from a liquid supply unit 5 that may comprise a tank, a pressure pump and a temperature regulator (not individually shown) to the space above the workpiece W under a temperature-regulated condition and is collected by a liquid recovery unit 6. The temperature of the liquid 7 is regulated to be approximately the same as the temperature inside the chamber in which the lithography apparatus 100 itself is disposed. Numeral 21 indicates supply nozzles through which the liquid 7 is supplied from the supply unit 5. Numeral 23 indicates recovery nozzles through which the liquid 7 is collected into the recovery unit 6. However, the structure described above with reference to FIG. 1 is not intended to limit the scope of the immersion lithography apparatus to which a fluid control system of the invention is applicable. In other words, a fluid control system of the invention is applicable to immersion lithography apparatus of many different kinds. In particular, the numbers and arrangements of the supply and recovery nozzles 21 and 23 around the light projection unit PL may be designed in a variety of ways for establishing a smooth flow and quick recovery of the immersion liquid 7.

Figure 4:
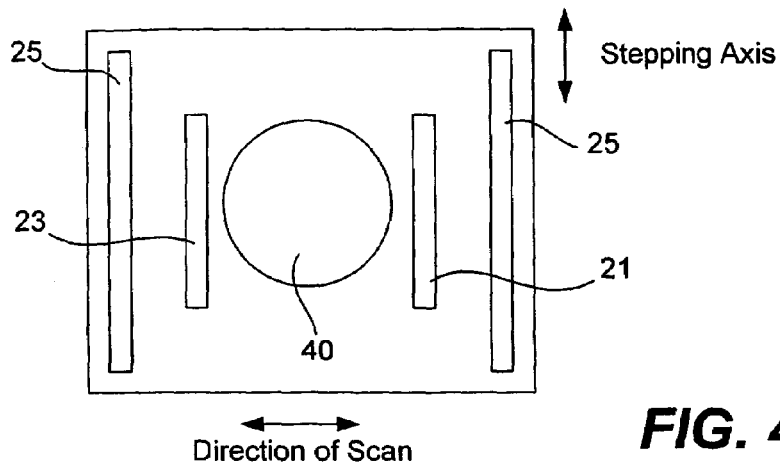
FIG. 4 is a schematic vertical view of a portion of an immersion lithography apparatus generally of a structure shown in FIG. 1 including a fluid control system embodying this invention.
Figure 5:
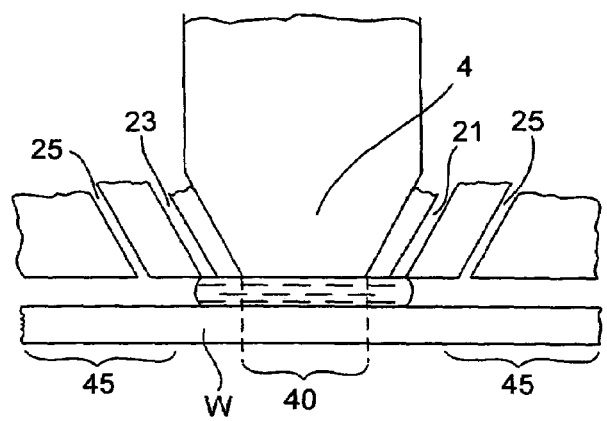
FIG. 5 is a schematic side view of a portion of the immersion lithography apparatus including the fluid control system shown in FIG. 4.

FIGS. 4 and 5 show a fluid control system according to one embodiment of the invention as incorporated in an immersion lithography apparatus structured as shown generally in FIG. 1, characterized as using a high-pressure gas for controlling the liquid 7. In FIGS. 4 and 5, numeral 40 indicates the area (hereinafter referred to as the exposure area) including an illumination field where the light IL from the illuminator optical unit 1 is incident and hence this is the area where the liquid 7 should be kept present during the exposure process. For this purpose, gas outlets 25 connected to a pressured gas source (not shown) are provided on opposite sides of the area including the exposure area 40 where the liquid 7 is intended to be confined. In FIG. 5, numeral 45 indicates what may be referred to as the "surrounding area" where the liquid 7 is controlled not to enter. In other words, the liquid 7 may be forced to move with respect to the last-stage optical element 4 as the workpiece is scanned but pressured gas from the gas outlets 25 serves to keep the liquid 7 sufficiently confined such that it will not move away from the exposure area 40 so much as to reach the specified surrounding area 45. From the point of view of this invention, therefore, the area specified herein as the surrounding area 45 may be regarded as defining the maximum distance the liquid 7 is permitted to move away from the exposure area 40.

There is no stringent requirement on the physical arrangement of the gas outlets 25. The pressured gas may be blown out of individual nozzles, or grooves may be formed on opposite sides of the exposure area 40 outside the supply and recovery nozzles 21 and 23 as shown in FIG. 4 such that the pressured gas can be emitted uniformly through one-dimensionally elongated inlet grooves to form a more uniform pressure wavefront to apply a uniform hydrodynamic force on the liquid 7. In one embodiment, the gas outlets 25 may be provided in the scanning directions as illustrated. In other embodiments, the gas outlets also may be provided in the stepping axis direction (not shown).

In another embodiment, the gas outlets may be provided in the scanning and stepping directions such that the exposure area 40 is surrounded with the gas outlets. In this case, gas pressure may be different between the gas outlets provided in the scanning directions and the gas outlets provided in the stepping directions. For example, the gas pressure of the outlets provided in the scanning directions may be stronger while the workpiece W (XY-stage 10) is moved in the scanning direction, and the gas pressure of the outlets provided in the stepping directions may be stronger while the workpiece W (XY-stage 10) is moved in the stepping direction. Also, in other embodiments, the gas outlets may be provided such that the exposure area 40 is encircled with the gas outlets. In this case, gas pressures may be different on the basis of position of the gas outlets, and/or may be changed in accordance with the motion (such as the moving velocity and the moving direction) of the workpiece W (XY-stage 10).

In order to minimize the turbulence that may be caused by the gas flow out of the outlets 25, it is desirable to arrange these nozzles or the outlet grooves 25 diagonally, or obliquely, with respect to the surface of the workpiece W, as schematically shown in FIG. 5, although the gas-supplying tubes or pipes (or "supply manifold") need not be attached to the rest of the liquid-supplying nozzle system. Generally, the liquid supply and recovery are designed such that a good balance should exist. If too much liquid is supplied, there will be a leak in the system. If too much recovery is used, it is possible that the gap could be pulled dry or bubbles could be drawn into the gap.

The gas pressure to be supplied depends upon the system configuration. In order to confine the immersion liquid, however, it should have a velocity of approximately 15 to 25 m/sec at the gas/liquid interface. In one specified embodiment, 20 m/sec was defined. An acceptable range, in view of factors such as the nozzle configuration, may be as wide as 2-200 m/sec).

The required flow velocity (gas pressure) also depends on the stage scanning speed, as well as the contact angle between the liquid 7 and the surface of the workpiece W. The stage scanning speed can vary from 10 mm/sec to 1000 mm/sec, or possibly even greater. The contact angle between the liquid 7 and the resist material on the workpiece W depends upon the resist material and also on how it has been treated. A standard ArF resist without any top coating will typically have a contact angle of 75°. Adding a topcoat can increase the contact angle to 110° or greater. With KrF, the contact angle is approximately 60°. For future technology, the contact angle will vary. Generally, the higher the contact angle, the less pressure is needed, and vice versa. Other factors such as the nozzle design and the scanning speed also will affect the needed pressure.

Figure 6:
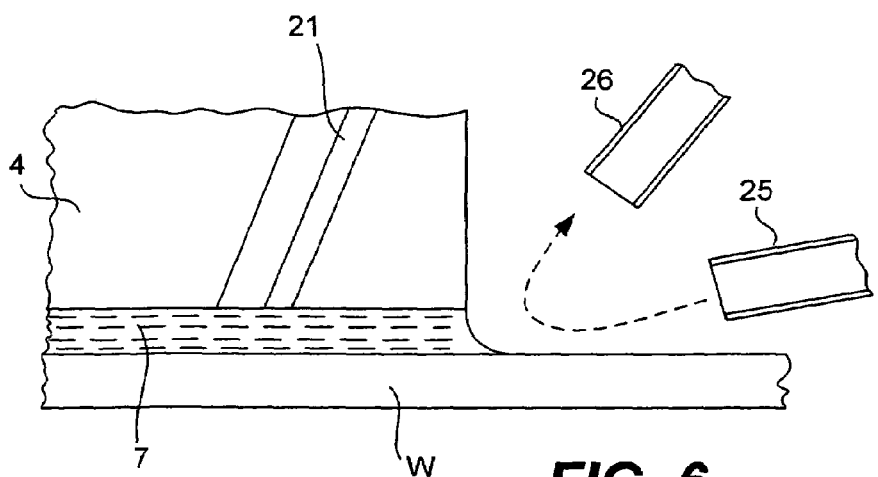
FIG. 6 is a schematic side view of a portion of a preferred embodiment of the immersion lithography apparatus including an exhaust manifold.

FIG. 6 shows an embodiment of the invention characterized as having an exhaust manifold 26 for removing the supplied gas in addition to the supply manifold 25 in order to further control the gas flow which is indicated schematically by way of a dotted arrow. It also has the feature of reducing the humidity in the scanner chamber by removing the gas that has been directly exposed to the liquid 7.

The gas need not be air. Any similar gas such as nitrogen can be used. Moreover, a gas that absorbs water better than air will be advantageous from the standpoint of water containment.

In general, immersion fluid containment is more difficult in the scanning direction as the travel of the wafer stage is greater in this direction. An air supply and exhaust manifold can be added to the stepping direction as well, or alternatively just a supply or an exhaust. The invention also can be applied to Twin-Stage-Type Lithography System as is disclosed in U.S. Pat. Nos. 6,262,796 and 6,341,007.

Figure 7:
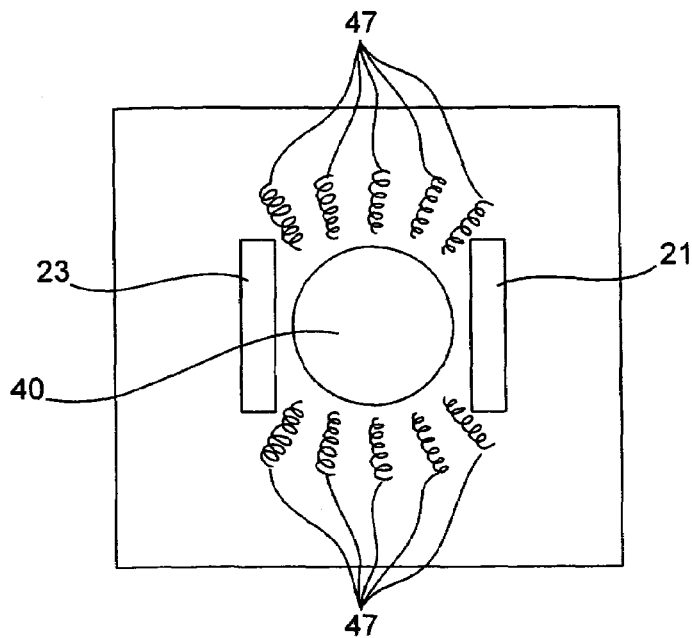
FIG. 7 is a schematic vertical view of a portion of an immersion lithography apparatus generally of a structure shown in FIG. 1 including another fluid control system according to a second embodiment of the invention.

FIG. 7 shows a second embodiment of the invention characterized as using a magnetostatic force to control the liquid 7 by containing it inside and in the immediate vicinity of the exposure area 40 and preventing it from reaching the surrounding area 45 as explained above. Water is typically used as the immersion fluid in immersion lithography, and water is known to be a magnetically responsive liquid, being diamagnetic. Thus, a magnetic force can be applied on such a fluid material by providing a suitable magnetic field over the area where the liquid 7 is confined. FIG. 7 shows an example in which a plurality of electromagnetic coils 47, serving together as a magnetic field generator, are arranged around the exposure area 40 and a magnetic field is generated so as to control the flow of the liquid 7. For the convenience of disclosure, the circuit for passing currents through these coils 47 is omitted.

In order to enhance the magnetically responsive characteristic of the immersion fluid such as water, powder of a ferromagnetic substance such as Ni, Fe and Co may be added to the liquid 7 to the extent that it will not adversely affect the transparency and other optical characteristics of the liquid 7.

The invention according to a third embodiment is characterized as using a rheological fluid, such as an electrorheological fluid (ERF) or a magnetorheological fluid (MRF) between the last-stage optical element 4 and the workpiece W, as the immersion fluid. An ERF is characterized as having the property of very low viscosity (i.e., less than 10 Pa-s) under normal conditions but very high viscosity when subjected to an electric field. An MRF is characterized as having the property of similarly very low viscosity under normal conditions but very high viscosity when subjected to a magnetic field. In the above, the expression "very high viscosity" means that these fluids become a so-called Bingham solid with viscosity no longer measurable.

Figure 8:
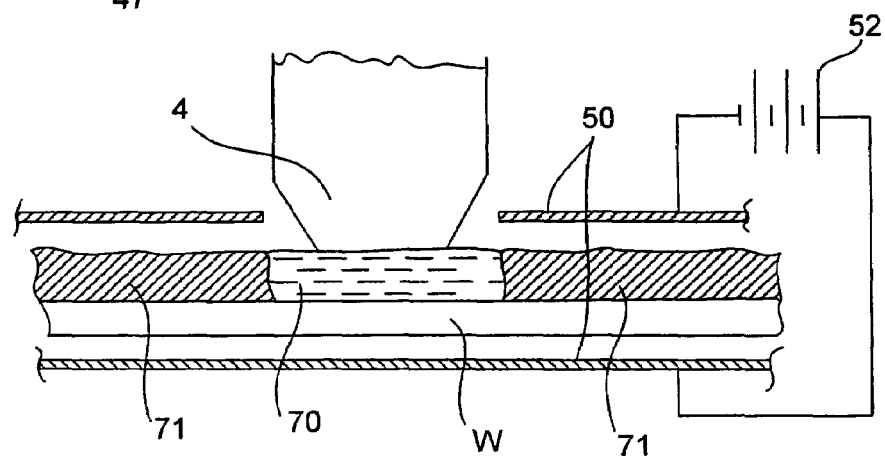
FIG. 8 is a schematic side view of a portion of the immersion lithography apparatus including a fluid control system according to a third embodiment of the invention.

FIG. 8 shows a fluid control system according to the third embodiment of the invention for immersion lithography characterized as using an ERF 70 and having capacitor electrodes 50 as an example of what is herein sometimes broadly referred to as a field generator that, in this instance, is a generator of an electrostatic field. The capacitor electrodes 50 are disposed as shown in FIG. 8 and connected to a voltage source 52 so as to generate an electrostatic field of 3-4 kV/mm which is considered sufficiently strong for solidifying the kind of ERF commonly available currently in a region surrounding the exposure area 40 such that the ERF 70 will remain in the liquid phase in the exposure area 40 but will solidify as indicated by numeral 71 in the surrounding area such that the ERF 70 in the liquid phase is contained within a region centering around the exposure area 40 and is prevented from entering the surround area.

Figure 9:
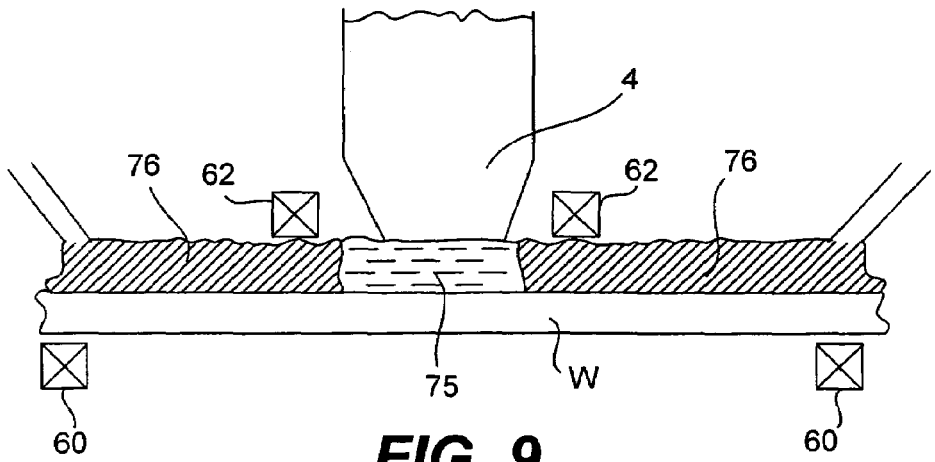
FIG. 9 is a schematic side view of a portion of the immersion lithography apparatus including another fluid control system according to an embodiment of the invention.

FIG. 9 shows another fluid control system according to the third embodiment of the invention for immersion lithography characterized as using an MRF 75 and having a magnetic field generator such as a coil 60 for generating a magnetostatic field of about 0.1-0.8 Tesla over the surface of the workpiece W and another field generator (herein referred to as the opposite field generator) 62 disposed as shown in FIG. 9 so as to generate a magnetic field equal to but oriented opposite to the magnetic field generated by the coil 60 within and about the exposure area 40 such that when both these coils 60 and 62 are switched on, the magnetic fields generated thereby effectively cancel each other within and in the vicinity of the exposure area 40. As a result, the portion of the MRF 75 within and in the vicinity of the exposure area 40 remains in the liquid phase but the MFR 75 is solidified, as indicated by numeral 76 in the surrounding area due to the magnetic field generated by the coil 60 such that the MRF 75 in the liquid phase is contained within a region centering around the exposure area 40 and is prevented from entering the surrounding area.

As the workpiece W is scanned under the light projection unit PL, the location of the opposite canceling field, which is fixed to the light projection unit PL, moves along the surface of the workpiece W. The opposite field provided by the opposite field generator 62 serves to desolidify and resolidify the fluid on the surface of the workpiece W such that the fluid 75 remains in the liquid phase within and in the vicinity of the exposure area 40.

Although the invention has been described above with reference to a limited number of embodiments, these embodiments and illustrated examples are not intended to limit the scope of the invention. Many modifications and variations are possible. For example, the electromagnets 47 in FIG. 7 need not be arranged as illustrated. Depending on the kind of immersion fluid and its flow speed, an accordingly more suitable arrangement may be selected by a person skilled in the art.

Figure 2:
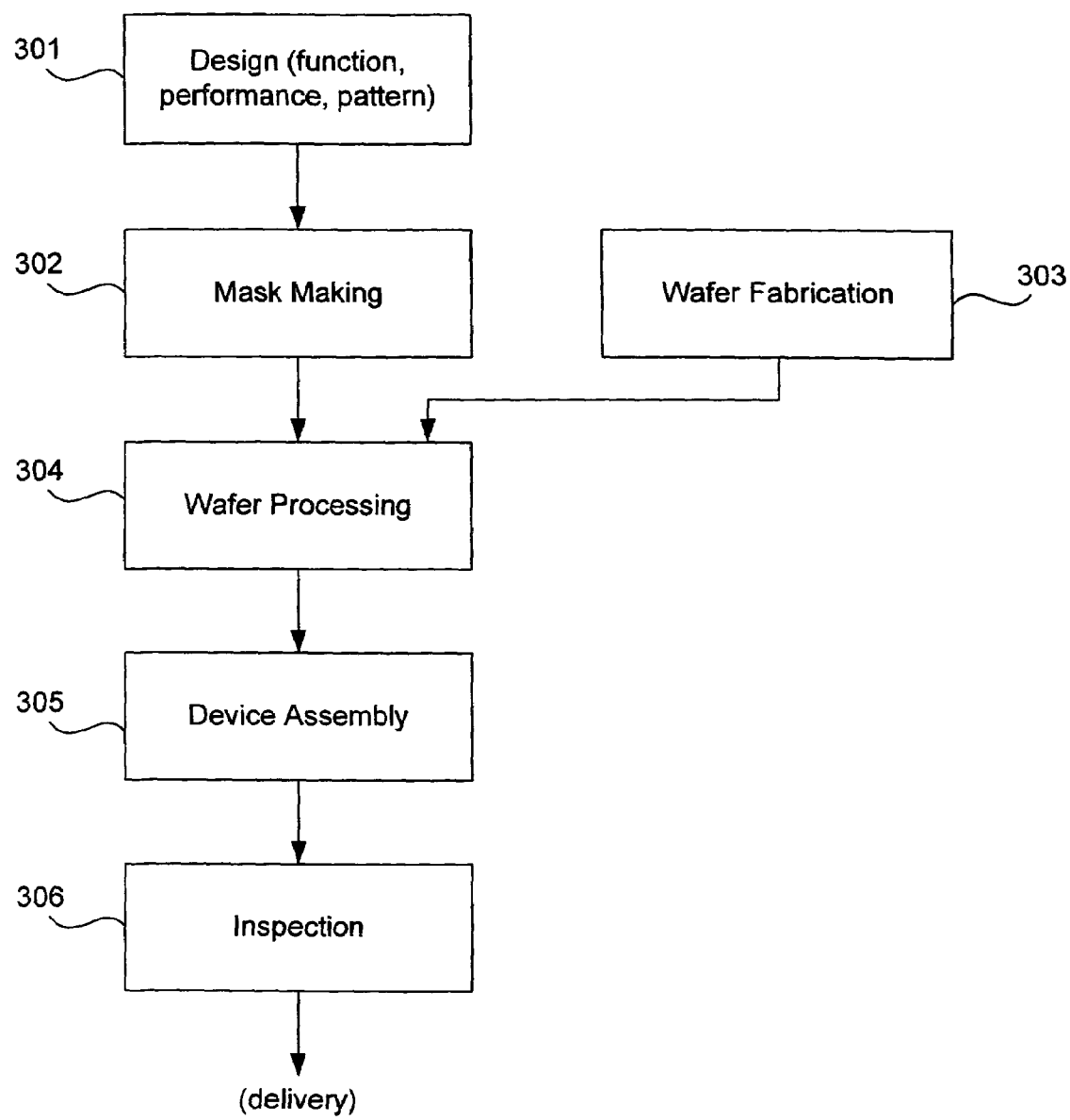
FIG. 2 is a flow diagram illustrating an exemplary process by which semiconductor devices are fabricated using the apparatus shown in FIG. 1 according to the invention.

FIG. 2 is referenced next to describe a process for fabricating a semiconductor device by using an immersion lithography apparatus incorporating a fluid control system embodying this invention. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
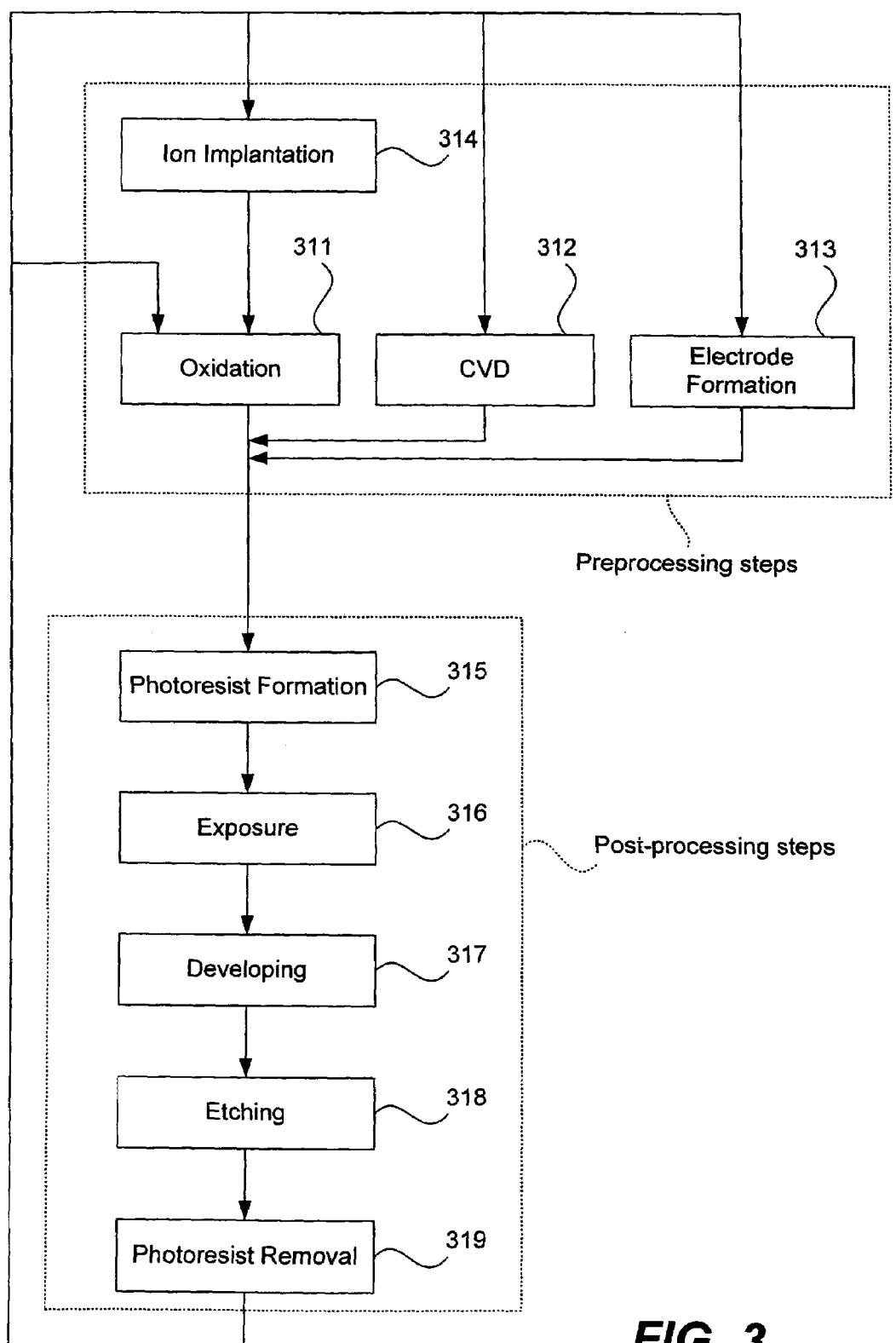
FIG. 3 is a flowchart of the wafer processing step shown in FIG. 2 in the case of fabricating semiconductor devices according to the invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The aforementioned steps 311-314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316 (exposure step), the above-mentioned exposure device is used to transfer the circuit pattern of a mask (reticle) onto a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While a lithography system of this invention has been described in terms of several preferred embodiments, alterations, permutations, and various substitute equivalents are possible. There are many alternative ways of implementing the methods and apparatus of the invention.

What is claimed is:

1. A fluid control system for immersion lithography, the fluid control system comprising:
   an optical member, a gap defined between the optical member and a surface disposed opposite the optical member;
   a fluid-supplying device that provides an immersion liquid to an exposure area in the gap; and
   a fluid control device that applies a force to the immersion liquid provided by the fluid-supplying device to prevent the immersion liquid from entering a specified surrounding area external to the exposure area, the fluid control device delivering a pressured gas in order to apply the force to the immersion liquid, the pressured gas having a speed of 2-200 m/sec.

2. The fluid control system of claim 1, wherein the fluid control device includes a source of the pressured gas and nozzles for delivering the pressured gas therethrough towards the exposure area.

3. The fluid control system of claim 2, wherein the nozzles are oriented diagonally with respect to the surface.

4. The fluid control system of claim 1, wherein the pressure of the pressured gas is at least partially determined by one or more factors selected from the group consisting of a scanning speed of an object having the surface and a contact angle between the surface of the workpiece and the immersion liquid.

5. The fluid control system of claim 1, wherein the pressured gas absorbs water to thereby reduce humidity.

6. The fluid control system of claim 1, wherein the fluid control device further includes an exhaust manifold for removing supplied gas.

7. The fluid control system of claim 1, wherein the pressured gas is air.

8. The fluid control system of claim 1, wherein the pressured gas is nitrogen.

9. The fluid control system of claim 1, wherein the pressured gas has a speed ranging from 15-25 m/sec.

10. The fluid control system of claim 2, wherein the nozzles are located adjacent to the exposure area on a side defined by a scanning direction of an object having the surface.

11. The fluid control system of claim 2, wherein the nozzles are located adjacent to the exposure area on a side defined by a stepping axis of the workpiece.

12. An immersion lithography apparatus comprising:
   a reticle stage adapted to hold a reticle;
   a working stage adapted to hold a workpiece having a surface;
   an optical system including an optical element, the workpiece being positioned opposite the optical element to define a gap between the optical element and the surface of the workpiece;
   a fluid-supplying device that provides an immersion liquid to an exposure area in the gap between the optical element and the surface of the workpiece during an immersion lithography process; and
   a fluid control device that applies a force to the immersion liquid provided by the fluid-supplying device to prevent the immersion liquid from entering a specified surrounding area external to the exposure area, the fluid control device delivering a pressured gas in order to apply the force to the immersion liquid, the pressured gas having a speed of 2-200 rn/sec.

13. The immersion lithography apparatus of claim 12, wherein the force is a hydrodynamic force and the fluid control device includes a source of the pressured gas and nozzles for delivering the pressured gas therethrough towards the exposure area, wherein the immersion liquid is prevented by the hydrodynamic force of the pressured gas from entering the surrounding area.

14. The immersion lithography apparatus of claim 13, wherein the nozzles are oriented diagonally with respect to the surface of the workpiece.

15. The immersion lithography apparatus of claim 12, wherein the pressure of the pressured gas is at least partially determined by one or more factors selected from the group consisting of a scanning speed of the workpiece and a contact angle between the surface of the workpiece and the immersion liquid.

16. The immersion lithography apparatus of claim 12, wherein the pressured gas is air.

17. The immersion lithography apparatus of claim 12, wherein the pressured gas is nitrogen.

18. The immersion lithography apparatus of claim 13, wherein the nozzles provide the pressured gas at a speed ranging from 15-25 m/sec.

19. The immersion lithography apparatus of claim 13, wherein the nozzles are located adjacent to the exposure area on a side defined by a scanning direction of the workpiece.

20. The immersion lithography apparatus of claim 13, wherein the nozzles are located adjacent to the exposure area on a side defined by a stepping axis of the workpiece.

21. A method for making an object, the method comprising:

forming an image of a pattern onto the object utilizing the immersion lithography apparatus of claim 13 by projecting the image from the reticle held by the reticle stage through the optical system and onto the object held as the workpiece on the working stage.

22. The method of claim 21, wherein the pressured gas is air.

23. The method of claim 21, wherein the pressured gas is nitrogen.

24. The method of claim 21, wherein the pressured gas has a speed ranging from 15-25 m/sec.

25. The method of claim 21, wherein the fluid control device includes the source of the pressured gas and nozzles, the nozzles being located adjacent to the exposure area on a side defined by a scanning direction of the workpiece.

26. The method of claim 21, wherein the fluid control device includes the source of the pressured gas and nozzles, the nozzles being located adjacent to the exposure area on a side defined by a stepping axis of the workpiece.

27. A method for patterning a wafer, the method comprising:

forming an image of a pattern onto the object utilizing the immersion lithography apparatus of claim 12 by projecting the image from the reticle held by the reticle stage through the optical system onto the wafer held as the workpiece on the working stage.

28. The method of claim 27, wherein the pressured gas is air.

29. The method of claim 27, wherein the pressured gas is nitrogen.

30. The method of claim 27, wherein the pressured gas has a speed ranging from 15-25 m/sec.

31. The method of claim 27, wherein the fluid control device includes the source of the pressured gas and nozzles, the nozzles being located adjacent to the exposure area on a side defined by a scanning direction of the workpiece.

32. The method of claim 27, wherein the fluid control device includes the source of the pressured gas and nozzles, the nozzles being located adjacent to the exposure area on a side defined by a stepping axis of the workpiece.

* * * * *

UNITED STATES PATENT AND TRADEMARK OFFICE
CERTIFICATE OF CORRECTION

PATENT NO. : 7,339,650 B2 Page 1 of 1
APPLICATION NO. : 11/237650
DATED : March 4, 2008
INVENTOR(S) : Coon et al.

It is certified that error appears in the above-identified patent and that said Letters Patent is hereby corrected as shown below:

Column 9, line 13, change "claim 13" to --claim 12--.

Signed and Sealed this

Twenty-fourth Day of June, 2008

JON W. DUDAS
*Director of the United States Patent and Trademark Office*